(12) United States Patent
Jussila et al.

(10) Patent No.: US 9,374,053 B2
(45) Date of Patent: Jun. 21, 2016

(54) RESISTOR NETWORK AND MIXER CIRCUITS WITH PROGRAMMABLE GAIN

(71) Applicant: Telefonaktiebolaget L M Ericsson (publ), Stockholm (SE)

(72) Inventors: Jarkko Jussila, Turku (FI); Pete Sivonen, Raisio (FI)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/419,197

(22) PCT Filed: May 5, 2014

(86) PCT No.: PCT/EP2014/059122
§ 371 (c)(1),
(2) Date: Feb. 2, 2015

(87) PCT Pub. No.: WO2015/169335
PCT Pub. Date: Nov. 12, 2015

(65) Prior Publication Data
US 2016/0049913 A1    Feb. 18, 2016

(51) Int. Cl.
*H03G 1/00* (2006.01)
*H04B 1/00* (2006.01)
*H01C 10/50* (2006.01)
*H04B 1/16* (2006.01)

(52) U.S. Cl.
CPC ............ *H03G 1/0088* (2013.01); *H01C 10/50* (2013.01); *H04B 1/0032* (2013.01); *H04B 1/16* (2013.01)

(58) Field of Classification Search
CPC ............... H03G 1/0088; H01C 10/16; H04B 2001/307; H04B 1/16
See application file for complete search history.

(56) References Cited

U.S. PATENT DOCUMENTS

| | | | |
|---|---|---|---|
| 7,162,029 B2 | 1/2007 | Soman et al. | |
| 8,351,978 B2 | 1/2013 | Tasic et al. | |
| 8,594,583 B2 | 11/2013 | Montalvo et al. | |
| 2009/0021331 A1* | 1/2009 | Hwang | H03H 11/245 333/81 R |
| 2012/0149321 A1* | 6/2012 | Montalvo | H04B 1/30 455/232.1 |

(Continued)

FOREIGN PATENT DOCUMENTS

EP     1811654 A1     7/2007

OTHER PUBLICATIONS

Cheng, W. et al., "A Wideband IM3 Cancellation Technique for CMOS Attenuators," 2012 IEEE International Solid-State Circuits Conference, Feb. 19-23, 2012, pp. 78-80.

(Continued)

*Primary Examiner* — Nguyen Vo
(74) *Attorney, Agent, or Firm* — Withrow & Terranova, PLLC

(57) ABSTRACT

A resistor network comprises one or more switched resistor branches. Each switched resistor branch comprises a first resistor connected in series with a first switch, wherein a first terminal of the first resistor is connected to the input terminal of the resistor network, a second terminal of the first resistor is connected to a first terminal of the first switch forming a middle node, and a second terminal of the first switch is connected to the output terminal of the resistor network. Each switched resistor branch further comprises a second resistor connected in series with a second switch, wherein the series connected second resistor and second switch is connected between the middle node and a third terminal of the one or more switched resistor branches. The resistor network further comprises a third resistor connected between the input and output terminals of the resistor network.

19 Claims, 9 Drawing Sheets

(56) References Cited

U.S. PATENT DOCUMENTS

2013/0155748 A1    6/2013    Sundstrom et al.
2014/0043099 A1*  2/2014    Igarashi .................... H03F 1/34
                                                                     330/260

OTHER PUBLICATIONS

International Search Report for PCT/EP2014/059122, mailed Feb. 11, 2015, 2 pages.

\* cited by examiner

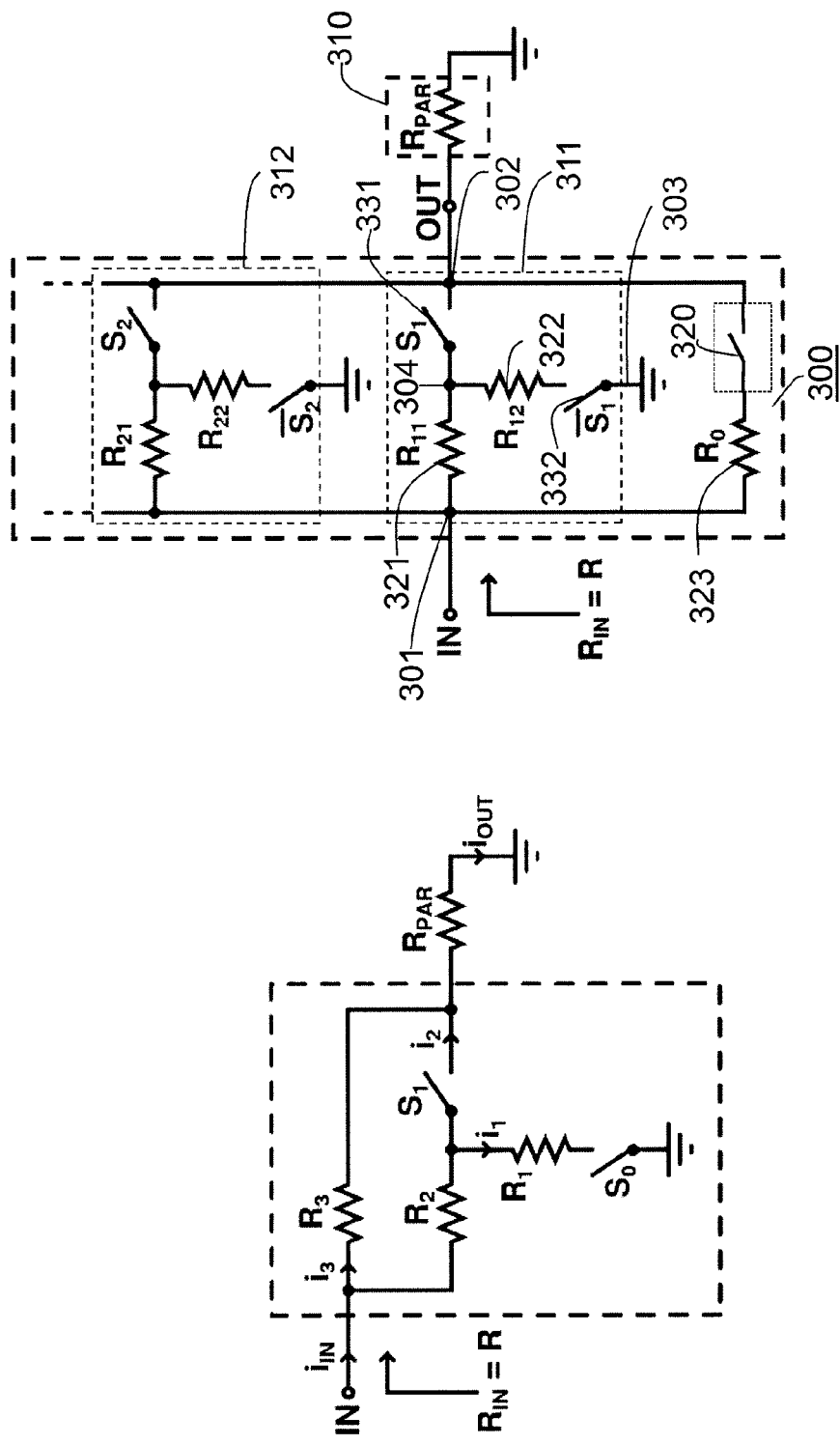

RESISTOR NETWORK AND MIXER CIRCUITS WITH PROGRAMMABLE GAIN

This application is a 35 U.S.C. §371 national phase filing of International Application No. PCT/EP2014/059122, filed May 5, 2014, the disclosure of which is incorporated herein by reference in its entirety.

TECHNICAL FIELD

Embodiments herein relate to a resistor network and mixer circuits using the resistor network. In particular, they relate to passive current-mode mixer circuits with programmable gain comprising a resistor network in a wireless communication device.

BACKGROUND

Building blocks of integrated radio Receivers (RXs), for example, Radio-Frequency (RF) parts, Analog Baseband circuit (ABB) and Analog-Digital Converters (ADCs), have limited dynamic ranges. An input power of a wanted signal may vary between, for example, −100 dBm and −15 dBm depending on different wireless or cellular systems. In addition, the power of interfering signals also varies significantly. A radio receiver chain is not allowed to be compressed in any situation by the wanted signal or the interfering and/or blocking signals. In addition, the level of the wanted signal at the inputs of the ADCs must be in a correct range to enable signal sampling and quantization or digitization with a sufficient Signal-to-Noise ratio (SNR) without compressing the ADCs. The dynamic range of the ADCs is not sufficient to cover a variation of approximately 90 dB in the possible input powers of the wanted signal while producing a sufficient SNR. Therefore, adjustable or programmable gain must be implemented in the preceding RF and analog parts to extend the dynamic range of the radio receiver by keeping the level of the wanted signal at the inputs of the ADCs within an optimal range. In modern radio receivers, gain adjustment is usually implemented with digital control, i.e. the RX gain can have different values having a certain difference, i.e. gain step, between them. The difference between consecutive gain values or the gain step may be, for example, 3 dB or 6 dB. The value of 6 dB is used quite commonly.

The accuracy of gain steps in programmable gain in a primary or diversity RX must meet certain requirements. The power of a received signal is measured in the RX of a Mobile Station (MS) and communicated to a Base Station (BS) or cellular network so that the BS can transmit data with an output power, which is optimal for the network capacity. The power of the received signal is usually measured in the digital circuit of the RX after the programmable analog gain implemented in the analog parts of the RX. If there is an error in the measured signal power due to an error in a gain step in the analog parts of the RX, the output power of the BS Transmitter (TX) for the corresponding MS is not optimal. This can affect the capacity of the BS or cellular network. Therefore, the required accuracy of power measurement in the RX is specified, which also sets requirements for the accuracy of the gain steps. Gain steps having different values or sizes, for example, multiples of 6 dB, may have different specifications.

Different gain values in an RX can be calibrated to correct values for each sample in production. Unfortunately, since there may be several gain settings in a single RX and there can also be several RXs integrated on the same chip, lots of parameters need to be measured and calibrated. In addition, one RX can have multiple Low Noise Amplifiers (LNAs) operating in different RF bands. This kind of calibration in production is expensive and should be avoided or minimized, if possible. A Measurement radio Receiver (MRX) is usually used to measure or monitor the TX output signal power and quality to provide data for calibration and tuning of the TX to optimize its performance. The MRX is usually integrated on the same chip with the rest of transceiver. Since the MRX is used, for example, to measure and calibrate the output power of the TX, the accuracy requirements for relative gains and, therefore, also for gain steps, in the MRX are stringent. Again, the amount of calibration of the MRX in production should also be minimized.

In modern radio RXs, most of or all of Direct Current (DC) offset compensations are usually implemented in digital circuits. If programmable gain is implemented at baseband in an RX and baseband gain is changed, the output DC offset may change abruptly, which may lead to degraded output signal quality. The digital DC offset compensation may not be able to react fast enough to a sudden change in the output DC offset. A change in the output DC offset due to a change in baseband gain can lead to degraded signal quality even if the change does not occur during the actual reception, for example, when the digital DC offset compensation subtracts an incorrect DC value from the digital output signal leaving part of the DC offset uncompensated. Such issues are possible in the primary and diversity RXs, as well as in the MRX. Therefore, implementation of programmable gain at baseband is not usually feasible.

Due to large interfering or wanted signals, the RX gain preceding the ABB needs to be decreased to avoid compression in the ABB. Thus, part of the programmable RX gain is usually implemented in the LNA, but it is challenging or technically not feasible to implement all of the programmable gain in the LNA. Since the maximum voltage gains of LNAs are usually 20-30 dB, the implementation of all required programmable gain in the LNA, for example 40-50 dB, would require the LNA to operate as an attenuator in lower gain settings, which would significantly increase the Noise Figure (NF) of the receiver and lead to a solution that would not be feasible. Since it is not desirable to implement programmable gain in the ABB and it is challenging to implement all programmable gain in the LNA, the rest of the programmable gain has to be implemented in down-conversion mixers.

Passive current-mode mixers are widely used in radio RXs because of their high dynamic range. Programmable gain may be implemented in the passive current-mode mixers by using a switched transconductance stage, gm-stage, comprising parallel branches that can be switched on and off. The problem with this solution is lower linearity and dynamic range because of the unavoidable nonlinearity of the voltage to current conversion in the gm-stage. The LNA voltage gain, which may be 20-30 dB, precedes the gm-stage of the mixers making the linearity requirements of the gm-stage stringent. Increasing the supply current to improve the linearity of the gm-stage is not a feasible solution. The lower linearity makes this solution less attractive.

Programmable gain may also be implemented in such passive current-mode down-conversion mixers by using programmable switched resistors in series with the mixing transistors in the mixers. One possibility to implement a switched resistor network, as described in A. S. Sedra, K. C. Smith, *Microelectronic Circuits*, Saunders College Publishing, USA, $3^{rd}$ edition, 1991, pp. 744-745, is to use an R2R network that can realize different gain levels with a 6-dB gain step, as shown in FIG. 1 (*a*). The R2R network is a resistor network that comprises cascaded repeating branches of a series resistor R and a switched shunt resistor 2R. However, in the passive current-mode mixer, the mixer switching devices have a non-zero parasitic input resistance, which degrades the accuracy of the gain steps in such configuration. The accuracy of the gain steps is limited in practice and can be insufficient in some applications, especially in an MRX but also in primary and diversity RXs. Another problem with the R2R network is that it cannot guarantee a fixed or well-regulated load impedance for the LNA.

SUMMARY

Therefore, a new solution is needed to implement programmable gain in passive-current mode down-conversion mixers with improved accuracy of gain steps and regulated input impedance looking into the mixers.

A first object of embodiments herein is to provide a resistor network for implementing programmable gain with improved performance.

According to a first aspect of embodiments herein, this object is achieved by a resistor network having an input terminal and an output terminal. The resistor network comprises one or more switched resistor branches.

Each switched resistor branch comprises a first resistor connected in series with a first switch in such a way that a first end of the first resistor is connected to the input terminal of the resistor network, a second end of the first resistor is connected to a first end of the first switch thereby forming a middle node, and a second end of the first switch is connected to the output terminal of the resistor network.

Each switched resistor branch further comprises a second resistor connected in series with a second switch between the middle node and a third terminal of the one or more switched resistor branches.

The resistor network further comprises a third resistor connected between the input and output terminals of the resistor network.

A second object of embodiments herein is to provide a mixer circuit with programmable gain with improved performance.

According to an aspect of embodiments herein, this object is achieved by a passive current-mode mixer circuit comprising the resistor network according to embodiments herein described above. The passive current-mode mixer circuit further comprises an I/Q mixer comprising an In-phase mixer and a Quadrature mixer. The I/O mixer is a single-ended mixer or a single-balanced mixer. The resistor network is used for setting different gains between a maximum gain and a minimum gain for the passive current-mode mixer circuit and maintains an input impedance for different gain settings taking into account input impedance of the I/Q mixer.

According to another aspect of embodiments herein, this object is achieved by a passive current-mode mixer circuit comprising two resistor networks according embodiments herein described above. The passive current-mode mixer circuit further comprises an I/Q mixer comprising an In-phase mixer and a Quadrature mixer. The I/Q mixer is a double-balanced mixer. The two resistor network are used for setting different gains between a maximum gain and a minimum gain for the passive current-mode mixer circuit and maintain an input impedance for different gain settings taking into account input impedance of the I/O mixer.

The resistor network according to embodiments herein have several advantages.

First, It enables more accurate gain steps in a passive current-mode down conversion mixer by using a topology of switched resistor network different from the R2R network. All switched resistor branches are connected between the input and output of resistor network, which is a clear difference compared to the R2R network. In principle, the resistor network can be used to implement a number of different gain values or settings depending on a number of switched resistor branches are used, and the value of gain step can also be selected, i.e. it can be different from the value of 6 dB available in the R2R network.

Second, the resistor network according to embodiments herein also maintains the input impedance within a certain tolerance at all gain settings taking into account the input impedance of the passive current-mode down conversion mixer circuit. Each switched resistor branch comprises two resistors and two switches. The second resistor that can be connected to ground with the second switch is used to keep the input resistance of the mixer circuit on the target value when this branch is disconnected from the mixer circuit. This prevents undesired shifts in gain steps. In addition, if an LNA in a primary or diversity RX is implemented as a resistive-feedback LNA, the mixer circuit including the resistor network according to embodiments herein forms a load for the LNA. Since the input impedance of the resistor network remains the target value at all gain settings, the load resistance of the LNA also remains the same. This means that the input matching of the LNA is not degraded.

Third, the location of gain-control switches, i.e. the first switch, in the resistor network according to embodiments herein is such that it enables good linearity even when the unavoidable nonlinearity of the gain-control switches, for example, implemented by NMOS or PMOS transistors, is included.

Thus, embodiments herein provide a resistor network with improved performance. Thanks to the improved performance of the resistor network, a mixer circuit using the resistor network to implement programmable gain also has improved performance since it fulfils both of the requirements for accurate gain steps and maintaining similar input impedance for all gain settings.

BRIEF DESCRIPTION OF THE DRAWINGS

Examples of embodiments herein are described in more detail with reference to attached drawings in which:

FIG. 2 is a simplified schematic of a resistor network with 2 gain settings according to embodiments herein.

FIG. 3 is a schematic of a resistor network with more than 2 gain settings according to embodiments herein.

DETAILED DESCRIPTION

As part of developing embodiments herein, problems with the R2R network will first be identified and discussed in detail.

Figure 1:
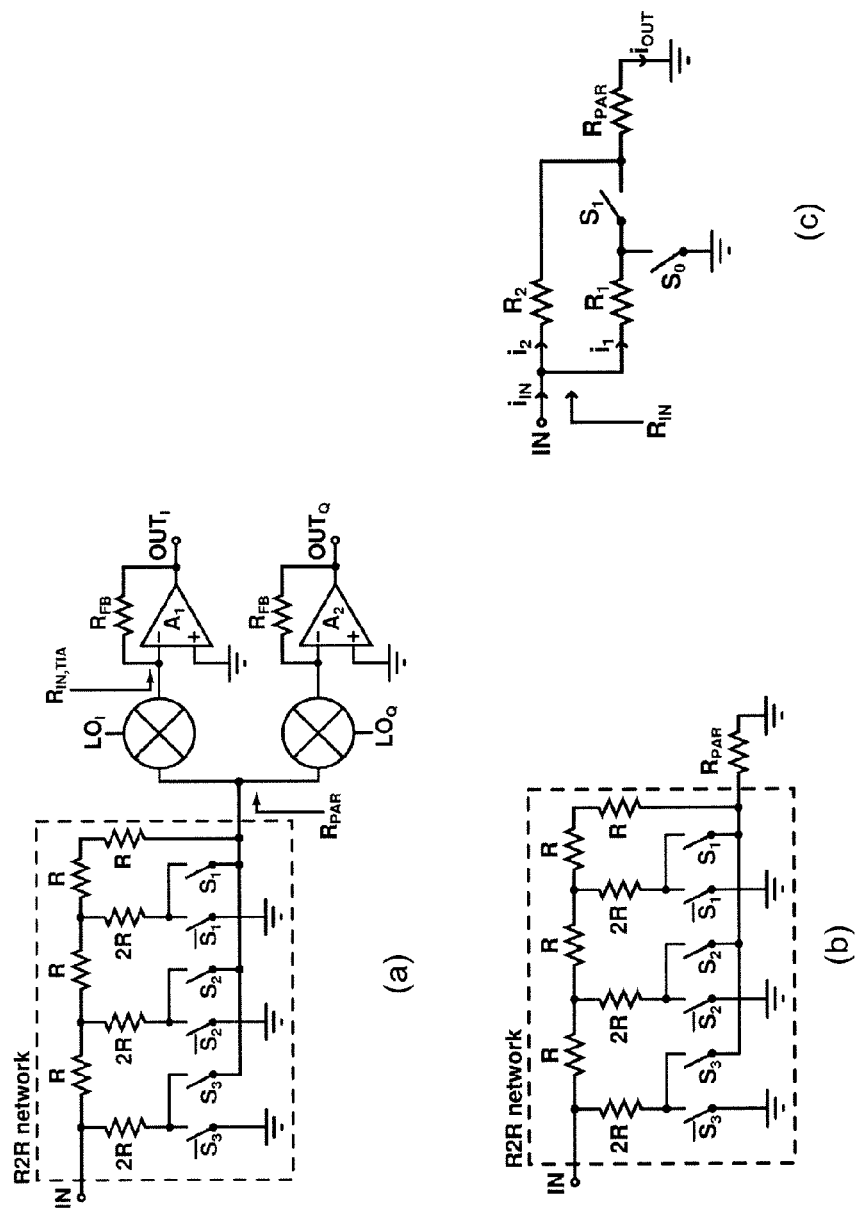
FIG. 1 are schematic diagrams illustrating: (a) a R2R network and a mixer using the R2R network; (b) a simplified circuit corresponding to FIGS. 1(a) and (c) a simplified schematic of the R2R network with 2 gain values, according to prior art.

A single-ended passive current-mode mixer with programmable gain implemented with an R2R network is shown in FIG. 1(a). The switching transistors of the passive current-mode down-conversion mixer have a parasitic input impedance $R_{PAR}$ seen from the RF port of the mixer and this impedance $R_{PAR}$ is in series with the R2R network, as shown in the simplified schematic in FIG. 1(b). In addition, the input impedance of the transferred impedance amplifier (TIA), $R_{IN,TIA}$, shown in FIG. 1(b), is in practice not zero and this impedance also affects the parasitic input impedance $R_{PAR}$. The effect of the input impedance of the TIA is included in $R_{PAR}$. The impedance $R_{PAR}$ affects the behavior of the R2R network which results in inaccurate gain steps. In practice, it is not possible to make the parasitic input impedance $R_{PAR}$ of the mixer insignificant since the effective transconductance gm of the mixer cannot be chosen freely. Decreasing the parasitic on-resistance of the switching transistors in the mixer by increasing the width of the switching transistors will increase power dissipation in the local oscillator (LO) circuits driving the mixer, since the parasitic capacitances associated with the switching transistors also increase proportionally. If the electrical performance of the receiver is already sufficient but the inaccuracy of gain steps in the down-conversion mixers is the only remaining issue, increasing further the width of the switching transistors to solve this problem is not a feasible solution, since power dissipation is one of the most significant characteristics of modern integrated radio receivers.

The input impedance of the down-conversion mixer forms a load for the preceding stage, which can, for example, be an LNA. The load impedance affects the LNA voltage gain and depending on the LNA topology, also possibly affects the LNA input impedance in the case of a feedback amplifier. If the input impedance of the mixer changes when the programmable gain of the mixer is changed, there will be an error in the gain step size of the receiver even if the gain step within the mixer block is accurate. The change in the mixer input impedance or in the LNA load impedance can also alter the LNA input impedance matching which is not desirable. Therefore, the input impedance/resistance of this kind of the mixer should be the same, or maintain at a certain value, at all gain settings to enable accurate receiver gain steps and maintain a fixed load impedance for the preceding block, such as an LNA. This is not the case if an R2R network is used with passive current-mode mixers.

So, the R2R network produces errors in gain steps even in the typical conditions because of $R_{PAR}$. However, the gain steps are also affected by process, temperature, and supply voltage (PTV) variations and the worst-case errors in gain steps including the PTV corners can become too large compared to the requirements. In addition, the frequency of operation, i.e. the LO frequency, can affect the accuracy of the mixer gain steps because of limited bandwidth in the signal path of the mixer including the LO circuit. The bandwidth can be limited by, for example, alternative current (AC) couplings and parasitic capacitances, and it also affected by the PTV variations. It will clearly be beneficial if the gain step of the mixer is correct in the typical PTV conditions and all margins in gain step accuracy can be allocated for the effect of variations in PTV parameters and frequency of operation.

In the following, the inaccuracy of gain steps in the circuit shown in FIG. 1(b) is shown mathematically. The simplified schematic of the R2R network implementing 2 gain values is shown in FIG. 1(c). This simplified schematic is sufficient to demonstrate the inaccuracy of gain steps in this topology. Again, $R_{PAR}$ represents the parasitic impedance/resistance at the input of the passive current-mode down-conversion mixers that are followed by TIAs forming virtual grounds to the mixer output nodes, i.e. $R_{PAR}$ captures both the parasitic resistance due to the mixer switches and the TIA input resistance. The biasing details are omitted. In practice, $R_{PAR}$ degrades the accuracy of gain steps. $R_{PAR}$ is assumed to be a given parameter and the resistances of $R_1$ and $R_2$ are design parameters. Thus, the values for $R_1$ and $R_2$ can be chosen based on design requirement as discussed below. It is also assumed for simplicity that switches $S_0$ and $S_1$ are ideal, i.e. their on-resistance is equal to zero and their off-resistance is infinite. In order not to affect the voltage gain at the input node driven in practice through non-zero impedance, the input resistance, $R_{IN}$, of the network should be the same at all gain settings. In 0-dB mode, i.e. in the high-gain setting, switch $S_1$ is closed and $S_0$ is open and the output current $i_{OUT}$ is $$i_{OUT} = i_1 + i_2 = i_{IN} \quad (1)$$

The input resistance of the network is $$R_{IN} = R_1 \| R_2 + R_{PAR} = R \quad (2)$$

In −6-dB mode, i.e. in the low-gain setting, switch $S_1$ is open and $S_0$ is closed and the output current $i_{OUT}$ becomes $$i_{OUT} = i_2 = \frac{R_1}{R_1 + R_2 + R_{PAR}} i_{IN} \quad (3)$$

In −6-dB mode, it is desired that $$\frac{i_{OUT}}{i_{IN}} = \frac{1}{2}$$

When gain is decreased to ½, the corresponding change in decibels is 20 log 10(½)≈6 dB. Then $$\frac{R_1}{R_1 + R_2 + R_{PAR}} = \frac{1}{2} \quad (4)$$

It is required that the input impedance remains the same, i.e. R, in −6-dB mode:

$$R_{IN} = R_1 \| (R_2 + R_{PAR}) = R \quad (5)$$

From Eq. (4), one can get $$2R_1 = R_1 + R_2 + R_{PAR} \Rightarrow R_1 = R_2 \pm R_{PAR} \quad (6)$$

Substituting Eq. (6) to Eq. (5), one gets $$R_{IN} = R = \frac{R_1(R_2 + R_{PAR})}{R_1 + R_2 + R_{PAR}} = \frac{(R_2 + R_{PAR})^2}{2(R_2 + R_{PAR})} = \frac{R_2 + R_{PAR}}{2} \quad (7)$$

$$\Rightarrow 2R = R_2 + R_{PAR} \Rightarrow R_2 = 2R - R_{PAR} \quad (8)$$

Substituting Eq. (8) into Eq. (6) one gets $$R_1 = 2R - R_{PAR} + R_{PAR} = 2R \Rightarrow R_1 = 2R \quad (9)$$

However, with Eq. (8) and (9), the input resistance in 0-dB mode becomes $$R_{IN} = R_1 \| R_2 + R_{PAR} = \quad (10)$$

$$\frac{2R(2R - R_{PAR})}{4R - R_{PAR}} + R_{PAR} = \frac{4R^2 + 2RR_{PAR} - R_{PAR}^2}{4R - R_{PAR}} \neq R$$

In fact, $R_{IN} > R$, which can be seen by the following $$\frac{4R^2 + 2RR_{PAR} - R_{PAR}^2}{4R - R_{PAR}} > R \Rightarrow 4R^2 + 2RR_{PAR} - R_{PAR}^2 > 4R^2 - RR_{PAR} \Rightarrow$$

$$3RR_{PAR} - R_{PAR}^2 > 0 \Rightarrow R_{PAR}(3R - R_{PAR}) > 0$$

which holds since in practice $R \gg R_{PAR}$. Therefore, it is seen that the R2R network with the parasitic input resistance $R_{PAR}$ cannot guarantee fixed input resistance $R_{IN} = R$ in both gain modes or settings with a 6-dB gain step. In fact, it is seen that only 2 design parameters $R_1$ and $R_2$ cannot fulfill 3 design constraints, which are (1) in 0-dB mode, $R_{IN} = R$; (2) in −6-dB mode, $R_{IN} = R$, i.e. fixed input resistance in both modes and (3) in −6-dB mode $i_{OUT} = 6/2$, i.e. −6-dB gain step.

In the following, gain step error caused by $R_{PAR}$ is calculated for the circuit shown in FIG. 1(c). The effect of the change in the input resistance is ignored in this calculation for simplicity, i.e. the output resistance of the preceding stage having voltage-mode output is 0Ω. Now, $R_{PAR} \neq 0$ and $R_1 = R_2 = 2R$. In 0-dB mode, the input voltage is $v_{IN}$ and the output current $i_{OUT}$ is $$i_{OUT} = \frac{v_{IN}}{R + R_{PAR}}.$$

In −6-dB mode, it is desired to get $$i_{OUT'} = \frac{v_{IN}}{2(R + R_{PAR})}$$

In −6-dB mode, one gets $$i_{OUT''} = \frac{2R}{(4R + R_{PAR})} i_{IN}$$

$$= \frac{2R \cdot v_{IN}}{(4R + R_{PAR}) \cdot (2R \| (2R + R_{PAR}))}$$

$$= \frac{v_{IN}}{2R + R_{PAR}}$$

The relation between the actual and desired gain steps becomes $$\frac{i_{OUT''}}{i_{OUT'}} = \frac{2R + 2R_{PAR}}{2R + R_{PAR}} \quad (11)$$

Eq. (11) shows that the gain step is too small, i.e. $i_{OUT''} > i_{OUT'}$, for practical values of $R_{PAR} > 0$ and $R > 0$. For example, if $R_{PAR} = 0.1 \cdot R$, the relation between the actual and desired gain steps becomes 1.0476, which corresponds to a gain step error of −0.40 dB.

It is also easy to see that with the R2R network shown in FIG. 1(c), the input resistance is different in 0-dB and −6-dB modes. When $R_1 = R_2 = 2R$, the input resistances in 0-dB mode, i.e. $R_{IN,A}$ and in −6-dB mode, i.e. $R_{IN,B}$ can be calculated from Eq. (2) and (5):

$$R_{IN,A} = R_1 \| R_2 + R_{PAR} = R + R_{PAR}$$

$$R_{IN,B} = R_1 \| (R_2 + R_{PAR}) = \frac{2R(2R + R_{PAR})}{4R + R_{PAR}}$$

It is straightforward to show that $$R_{IN,A} > R_{IN,B} \Rightarrow R > -\frac{1}{3} R_{PAR}$$

which means that the input resistance in −6-dB mode is smaller than that of in 0-dB mode since $R_{PAR} > 0$ and $R > 0$. If the LNA in a primary or diversity RX is implemented as a resistive-feedback LNA, the mixer including the R2R resistor network used for implementing programmable gain forms a load for the LNA. If the input resistance of the R2R resistor network does not remain the same when the mixer gain is changed, the load resistance of the LNA changes between different gain settings, which can degrade the input matching of the LNA. If the preceding stage driving the input of the R2R has a finite output resistance, the decrease in the input impedance of the R2R network in −6-dB mode means that the voltage gain at the input of the R2R network decreases compared to 0-dB mode.

Depending on the output stage of the preceding block, this can partially or completely compensate or even overcompensate for the error in the gain step, e.g. the gain step is too small, in the simplified example of FIG. 1(c) having only 2 gain settings. This is however not a practical way to try to correct the gain steps since this would create one or more new design constraints for the preceding stage, which would make the design of the preceding stage more complicated and could lead to a non-optimal performance for the whole receiver. The design would also become less modular, which is in practice a clear drawback in the design phase.

It is also possible that this condition cannot be fulfilled in practice or the designer of the mixer has no control on the output impedance of the preceding stage. This is the case, for example, in an MRX. The off-chip impedance connected to the RF input of the MRX is not necessarily controllable by the integrate circuit designers. In addition, that impedance cannot be kept constant, it does not track the actual resistance values or other relevant process parameters on the integrate circuit, and in practice it varies within a certain range. As a conclusion, this is not a feasible nor practical solution and a better solution is needed.

According to embodiments herein, a simplified schematic of a resistor network implementing 2 gain values is shown in FIG. 2. In the following, this simple schematic is used to demonstrate the ability of proposed topology to implement accurate gain steps while maintaining a constant input impedance or resistance in both gain settings according to embodiments herein. As shown in FIG. 2, the resistor network 200 with 2 gain values comprises a resistor $R_3$ connected between an input terminal and an output terminal of the resistor network 200 and a switched resistor branch also connected between the input and output terminals of the resistor network 200. The switched resistor branch comprises a resistor $R_2$ connected in series with a switch $S_1$ between the input and output terminals of the resistor network 200, and a resistor $R_1$ connected in series with a switch $S_0$ between a middle node formed by the connection of $R_2$ and $S_1$ and a third terminal, i.e. ground in FIG. 2. Again, $R_{PAR}$ represents the parasitic resistance at the input of a circuit connected to the resistor network, e.g. passive current-mode down-conversion mixers followed by a TIA. The biasing details are omitted. In practice, $R_{PAR}$ is assumed to be a given parameter and the resistances of $R_1$, $R_2$, and $R_3$ are the design parameters. Again, the switches $S_0$ and $S_1$ are assumed to be ideal. In order not to affect the voltage gain at the input node of the resistor network, the input resistance of the resistor network should be the same at all gain settings. In 0-dB mode, i.e. in the high-gain setting, switch $S_1$ is closed and $S_0$ is open, therefore current $i_1=0$, and current $i_{OUT}$ is $$i_{OUT} = i_2 + i_3 = i_{IN} \quad (12)$$

Assume that it is desirable that the input resistance $R_{IN}$ of the network has a certain value R. Then, one can write $$R_{IN} = R = R_2 \| R_3 + R_{PAR} \quad (13)$$

In −6-dB mode, i.e. the low-gain setting, switch $S_1$ is open and $S_0$ is closed, then the output current $i_{OUT} = i_3$, since $i_2 = 0$. The currents $i_1$ and $i_3$ can be written as $$i_1 = \frac{R_3 + R_{PAR}}{R_1 + R_2 + R_3 + R_{PAR}} i_{IN} \quad (14)$$

$$i_3 = \frac{R_1 + R_2}{R_1 + R_2 + R_3 + R_{PAR}} i_{IN} \quad (15)$$

In order to get a 6-dB gain step, the relation between current $i_1$ and $i_{IN}$ must be $$\frac{i_1}{i_{IN}} = \frac{1}{2} = \frac{R_3 + R_{PAR}}{R_1 + R_2 + R_3 + R_{PAR}} \Rightarrow R_1 = R_3 + R_{PAR} - R_2 \quad (16)$$

And it is desired that the input resistance $R_{IN}$ has the same value R in −6-dB-mode $$R_{IN} = R = \frac{(R_1 + R_2)(R_3 + R_{PAR})}{R_1 + R_2 + R_3 + R_{PAR}} \quad (17)$$

Using Eq. (16) and (17) one gets $$R_{IN} = R \quad (18)$$
$$= \frac{(R_3 + R_{PAR} - R_2 + R_2)(R_3 + R_{PAR})}{R_3 + R_{PAR} - R_2 + R_2 + R_3 + R_{PAR}}$$
$$= \frac{(R_3 + R_{PAR})}{2} \Rightarrow$$

$$R_3 = 2R_{IN} - R_{PAR} = 2R - R_{PAR} \quad (19)$$

Substituting Eq. (19) into Eq. (16) one gets $$R_1 = 2R - R_{PAR} + R_{PAR} - R_2 = 2R - R_2 \quad (20)$$

Now, since it is desired that the resistor network presents a constant input resistance of R also in the 0-dB mode, that is $$R_{IN} = R = \frac{R_2 R_3}{R_2 + R_3} + R_{PAR} \quad (21)$$

then $$RR_2 + RR_3 = \quad (22)$$
$$R_2 R_3 + R_2 R_{PAR} + R_3 R_{PAR} \Rightarrow R_2(R_3 + R_{PAR} - R) = R_3(R - R_{PAR})$$

$$R_2 = \frac{R_3(R - R_{PAR})}{R_3 + R_{PAR} - R} \quad (23)$$

Substituting Eq. (19) into Eq. (23) one gets $$R_2 = \frac{(2R - R_{PAR})(R - R_{PAR})}{2R - R_{PAR} + R_{PAR} - R} \Rightarrow R_2 = \frac{(2R - R_{PAR})(R - R_{PAR})}{R} \quad (24)$$

Now R1 can be calculated $$R_1 = 2R - R_2 \quad (25)$$
$$= 2R - \frac{(2R - R_{PAR})(R - R_{PAR})}{R}$$
$$= \frac{2R^2 - (2R^2 - 2RR_{PAR} - RR_{PAR} + R_{PAR}^2)}{R}$$

$$R_1 = \frac{3RR_{PAR} - R_{PAR}^2}{R} \Rightarrow R_1 = \frac{R_{PAR}(3R - R_{PAR})}{R}$$

It can be seen that now there are three design equations, one for each resistor, i.e. Eq. (25) for $R_1$, Eq. (24) for $R_2$, and Eq. (19) for $R_3$. In other words, 3 design parameters $R_1$-$R_3$ can fulfill 3 design constraints, which are (1) in 0-dB mode, $R_{IN}=R$; (2) in −6-dB mode, $R_{IN}=R$; i.e. fixed input resistance in both gain settings and (3) in −6-dB mode, $i_{OUT}=i_{IN}/2$, i.e. a −6-dB gain step. For example, the following table shows $R_1$, $R_2$, and $R_3$ values for 2 different Rpar values and 6 dB gain step for a given Rin=300Ω:

| Rpar (Ω) | $R_1$ (Ω) | $R_2$ (Ω) | $R_3$ (Ω) |
|---|---|---|---|
| 40 | 114.7 | 485.3 | 560 |
| 80 | 218.7 | 381.3 | 520 |

Therefore, the resistor network according to embodiments herein enables accurate gain steps in the typical PTV condition and also maintains the same input impedance at all gain settings taking into account the input parasitic impedance of the circuit following the resistor network. The gain step is now accurate regardless of the output impedance of preceding block, which makes this a modular solution.

The resistor network according to embodiments herein can be used to implement a number of different gain settings depending on the number of the switched resistor branches used. One embodiment is shown in FIG. 3. The resistor network 300 has an input terminal IN and an output terminal OUT and comprises one or more switched resistor branches 311, 312, . . . . Each switched resistor branch 311, 312 comprises a first resistor 321, i.e. R11, R21, connected in series with a first switch 331, i.e. $S_1$, $S_2$. A first end 301 of each first resistors 321, i.e. $R_{11}$, $R_{21}$ . . . is connected to the input terminal IN of the resistor network 300, and a second end 302 of each first switches 331, i.e. $S_1, S_2$ is connected to the output terminal OUT of the resistor network 300. In each of the switched resistor branch 311, 312, a second end of the first resistor 321 is connected to a first end of the first switch 331 forming a middle node 304.

Each switched resistor branch 311, 312 further comprises a second resistor 322, i.e. $R_{12}, R_{22}$ ... connected in series with a second switch 332, i.e. $\overline{S}_1, \overline{S}_2$, which are connected between the middle node 304 and a third terminal 303 of the switched resistor branch 311, 312. As shown in FIG. 3, the position of the second resistor 322 is above the second switch 332, However the position of the second resistor 322 and second switch 332 may be interchanged such that the position of the second resistor 322 may be under the second switch 332.

The resistor network 300 further comprises a third resistor 323, i.e. $R_0$ connected between the input IN and output OUT terminals of the resistor network 300. The resistor network 300 can be used to implement a number of different gain settings depending on the number of the switched resistor branches used for a circuit 310 connected to it as shown in FIG. 3. $R_{PAR}$ represents the parasitic input impedance of the circuit 310. The resistor network 300 can set different gains between a maximum gain and a minimum gain for the circuit 310 connected to the resistor network 300 by switching on the first switch 331 and switching off the second switch 332, or switching off the first switch 331 and switching on the second switch 332 in the one or more switched resistor branches 311, 312. The resistor network 300 maintains an input impedance for all different gain settings taking into account the input impedance of the circuit 310 by choosing appropriate values for the first resistor 321 and the second resistor 322 in each of the one or more switched resistor branches 311, 312 and for the third resistor 323 in the resistor network 300. As discussed above, in order to have accurate gain steps, the input resistance shall maintain similar at all gain settings. The input impedance may vary within a tolerance of ±10% between any two adjacent gain settings when all PTV variations and device mismatches are taken into consideration.

In some embodiments, a switch 320, as shown in dotted box in FIG. 3, may be used in series with the third resistor 323, connected between the third resistor 323 and the output terminal of the resistor network 300, for example, to switch off all resistor branches from the circuit 310. This may be required if more than one resistor network is connected to the input of the circuit 310 to combine signal paths from preceding blocks, for example, separate LNAs, when only one LNA is active at a time.

The value of gain step in the resistor network 300 according to embodiments herein can be selected freely, i.e. it can be different from the value of 6 dB available in the R2R network. All switched resistor branches are connected between the input and output of resistor network, which is a clear difference compared to the R2R network.

In the resistor network 300 according to embodiments herein, the location of all switches, including the first and second switches 331, 332, i.e. $S_1, S_2, \overline{S}_1, \overline{S}_2$ in each switched resistor branch is such that it enables good linearity even when taking into consideration the unavoidable nonlinearity of the gain-control switches, for example, N-channel Metal-Oxide-Semiconductor (NMOS) or P-channel MOS (PMOS) transistors. The reason for this is that the drain-source voltage swings of the gain-control switches are smaller than the voltage swing at the input of the resistor network regardless of whether the switch is closed or open. The parasitic input resistance of the circuit 310 is much smaller than the effective resistance of the resistor network 300 and, therefore, the voltage swing at the output of the resistor network 300 is much smaller than that of at the input, i.e. the output of the resistor network is connected to a low impedance. In addition, the on-resistances of the closed gain-control switches are much smaller than the resistances of the corresponding series connected resistors and all gain-control switches are connected to a low-impedance node, i.e. ground or the output of the resistor network 300. Further, when switch $S_1$ is open and $\overline{S}_1$ is closed, resistors $R_{11}$ and $R_{12}$ form a voltage divider, which decreases the voltage swing over the open switch $S_1$, thus the parasitic nonlinear current through $S_1$ is decreased.

The typical on-resistances of the gain-control switches controlling the programmable gain can be taken into account when the resistances of the corresponding series connected resistors are determined. For example, the resistance of $R_{11}$ should be decreased by the on-resistance of $S_1$. The dimensions and on-resistances of these gain-control switches could be scaled according to the corresponding series connected resistors to keep the relative resistances of the corresponding branches correct in PTV corners.

Figure 4:
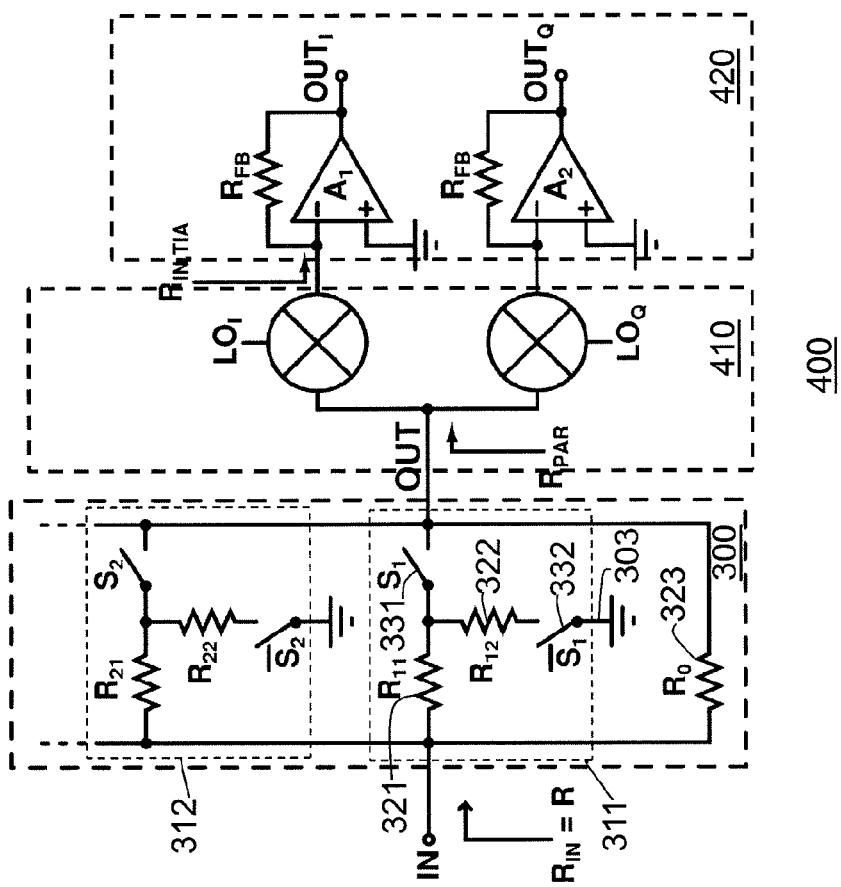
FIG. 4 is a schematic diagram illustrating a single-ended passive current-mode mixer with programmable gain according to embodiments herein.

According to some embodiments, the resistor network 300 may be used to implement programmable gain for a passive current-mode mixer circuit as shown in FIG. 4. The passive current-mode mixer circuit 400 comprises the resistor network 300. The mixer circuit further I/Q mixer 410 which comprises an In-phase mixer and a Quadrature mixer. The I/Q mixer 410 according embodiments herein is a single-ended mixer, since it operates with a single-ended Local Oscillator (LO) signal and a single-ended RF signal.

As shown in FIG. 4, the input terminals of the I/Q mixer 410 are connected together to the output terminal OUT of the resistor network 300, either directly or via a capacitor (not shown). The third terminal 303 in each of the one or more switched resistor branches 311, 312 is connected to ground. The outputs of the I/Q mixer are connected to TIAs 420.

As discussed above, the resistor network 300 can be used for setting different gains between a maximum gain and a minimum gain for the passive current-mode mixer circuit 400 by switching on the first switch 331 and switching off the second switch 332, or switching off the first switch 331 and switching on the second switch 332 in each of the one or more switched resistor branches 311, 312. The resistor network 300 can maintain a target input impedance for the different gain settings taking into account the input impedance of the I/Q mixer 410 by choosing appropriate values for the first resistor 321 and the second resistor 322 in each of the one or more switched resistor branches 311, 312 and for the third resistor 323 in the resistor network 300.

Figure 5:
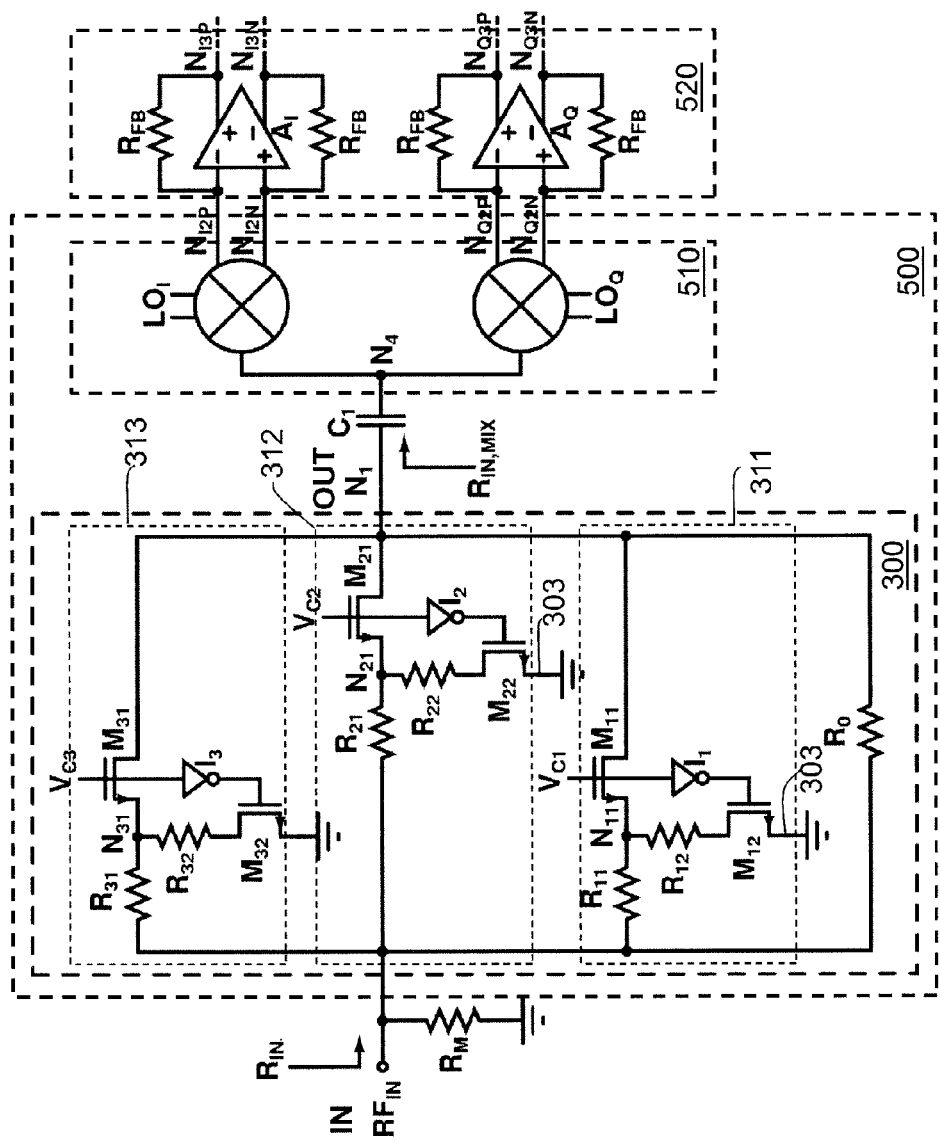
FIG. 5 is a schematic diagram illustrating a single-balanced passive current-mode mixer with programmable gain according to embodiments herein.

In some embodiments, the resistor network 300 can be used to implement programmable gain for a passive current-mode mixer circuit as shown in FIG. 5. The passive current-mode mixer circuit 500 comprises the resistor network 300, which comprises 3 switched resistor branches 311, 312, 313. The first switched resistor branch 311 comprises a first resistor $R_{11}$ and a first switch $M_{11}$ connected in series, a second resistor $R_{12}$ and a second switch $M_{12}$ connected in series between node $N_{11}$ and ground. The mixer circuit further comprises I/Q mixer 510 comprising an In-phase mixer and a Quadrature mixer. The I/Q mixer 510 according to embodiments herein is a single-balanced mixer, since it operates with a double-balanced Local Oscillator (LO) signal and a single-ended RF signal. As shown in FIG. 5, the gain-control switches $M_{11}, M_{12}$ etc are implemented with NMOS transistors, and control signals for the first and second switches, i.e. $M_{11}$ and $M_{12}$, in each of the switched resistor branch are complementary, e.g. implemented with an inverter $I_1$.

As shown in FIG. 5, the input terminals of the I/Q mixer 510 are connected together to the output terminal OUT of the resistor network 300 via a capacitor $C_1$. Alternatively, the input terminals of the I/Q mixer 510 may be connected together to the output terminal OUT of the resistor network 300 directly. The third terminal 303 in each of the one or more switched resistor branches 311, 312, 313 is connected to ground. The outputs of the I/Q mixer 510 are connected to TIAs 520.

The resistor network 300 according to embodiments herein makes it possible to do a design centering for mixer gain steps in the typical PTV conditions and at frequency of operation. Now, all margin or tolerance in gain step accuracy can be allocated for the effect of variations in PTV parameters and/or the frequency of operation. Thus, gain steps between the maximum gain and the minimum gain can be set freely and maintain certain accuracy, when keep the input impedance variation, e.g. within ±10%, taking into account device mismatches and variations in process, temperature and voltage.

The gain-control switches may also be implemented with different types of transistors and also as more complicated structures instead of only one transistor, for example, as T-network that comprises 3 switches and provides improved switch isolation in off-state. In some of the switched resistor network branches, the second resistor 322 may be excluded, i.e. the second resistor 322 may be replaced with a short circuit, if the accuracy of gain step is sufficient without that resistor. This may be the case with the branches implementing small gains where the value of $R_{PAR}$ can be insignificant compared to the resistor value in that branch.

The signal path of the switched resistor branch is biased to 0V since this maximizes the gate-source voltages of NMOS switches that are closed and thereby minimizes the switch on-resistances. $C_1$ is an Alternating Current (AC) coupling capacitor, which separates the DC voltages of the resistor network from that of the switching transistors in the mixer.

The maximum gain is achieved by switching on the first switch 331 and switching off the second switch 332 in all switched resistor branches 311, 312, 313 and the minimum gain is achieved by switching off the first switch 331 and switching on the second switch 332 in all switched resistor branches 311, 312, 313. For example, in FIG. 5, at the maximum gain, $V_{C1}=V_{C2}=V_{C3}=V_{DD}$, i.e. the supply voltage, then switches $M_{11}$, $M_{21}$ and $M_{31}$ are turned on or closed, and switches $M_{12}$, $M_{22}$ and $M_{32}$ are turned off or open. When gain is decreased by one step, one of the switched resistor branches is disconnected from the I/Q mixer 510 and connected to ground. The gain can be decreased by one step by setting, for example, $V_{C3}=0V$ and $V_{C1}=V_{C2}=V_{DD}$. At the minimum gain, $V_{C1}=V_{C2}=V_{C3}=0V$, then switches $M_{11}$, $M_{21}$ and $M_{31}$ are turned off or open, and switches $M_{12}$, $M_{22}$ and $M_{32}$ are turned on or closed.

In FIG. 5, resistor $R_M$ is used to match the RF input to a specified impedance, which is usually 50Ω. In this embodiment, the resistor network 300 is single ended, i.e. all third terminals 303 in each of the switched resistor branch are connected to ground.

In some embodiments, separate resistor networks may be used for the I/Q mixer 410, 510, one for the In-phase mixer and one for the Quadrature mixer. The two resistor networks may have a common input, either single-ended or differential, and separate outputs connected to the different In-phase mixer and Quadrature mixer.

Figure 6:
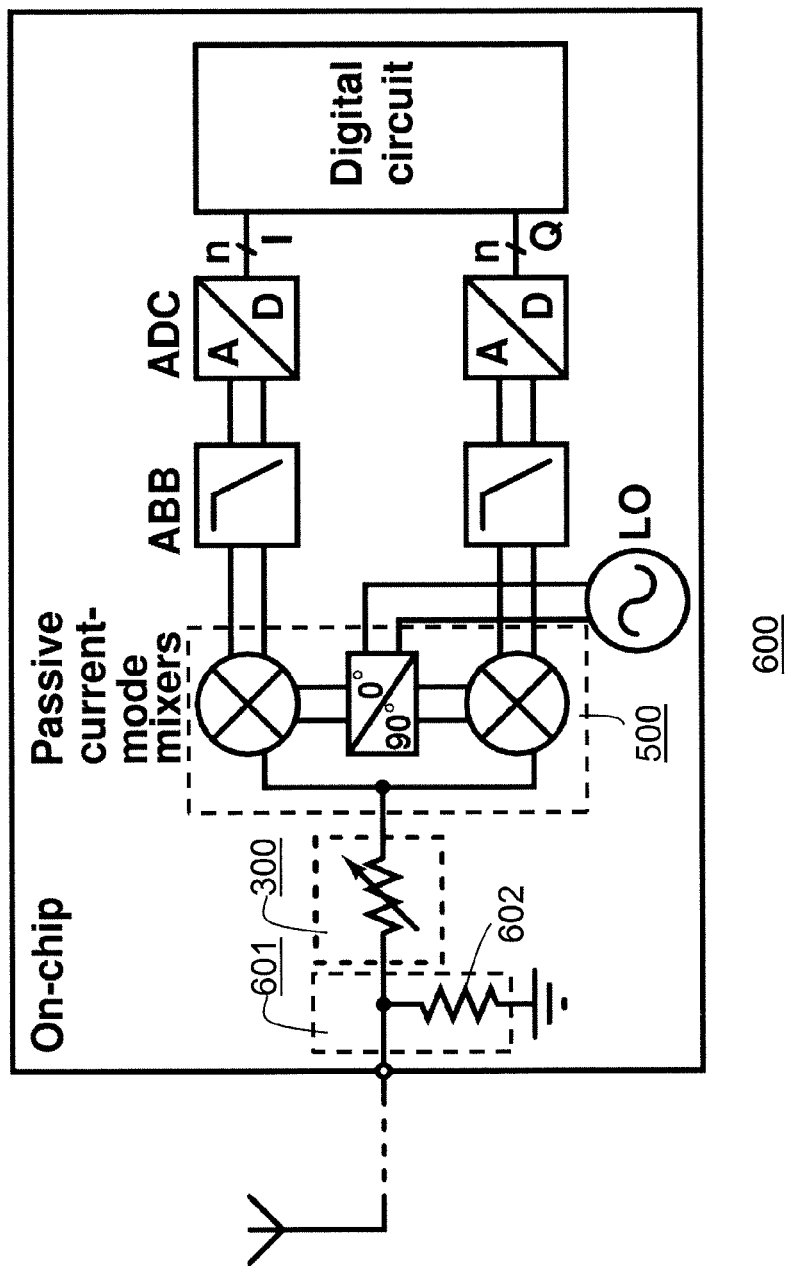
FIG. 6 is a schematic diagram illustrating a receiver with a single-balanced programmable gain passive current-mode mixer according to embodiments herein.

According to some embodiments, an MRX utilizing direct conversion architecture and having a single-ended RF input and a programmable gain passive current-mode down-conversion mixer circuit is shown in FIG. 6. The receiver 600 comprises a passive current-mode mixer circuit 500 as shown in FIG. 5, which comprises the resistor network 300. In an MRX, an LNA is not needed at the front of the receiver since the MRX measures an attenuated version of a TX signal from an associated transmitter and the MRX input power levels are therefore relatively high. The programmable gain passive current-mode down-conversion mixer circuit 500 can be connected to the input of MRX with resistors to implement a highly linear MRX. Therefore, the resistor network 300 is connected to the input of the receiver 600 directly or through a passive network 601 by the input terminal IN of the resistor network 300. Resistor 602 is an input matching resistor and may be a part of the passive network 601. Since the implementation of programmable gain at baseband may not be feasible and the LNA does not exist in the MRX, all of programmable gain is implemented in the down-conversion mixer circuit 500.

Figure 7A:
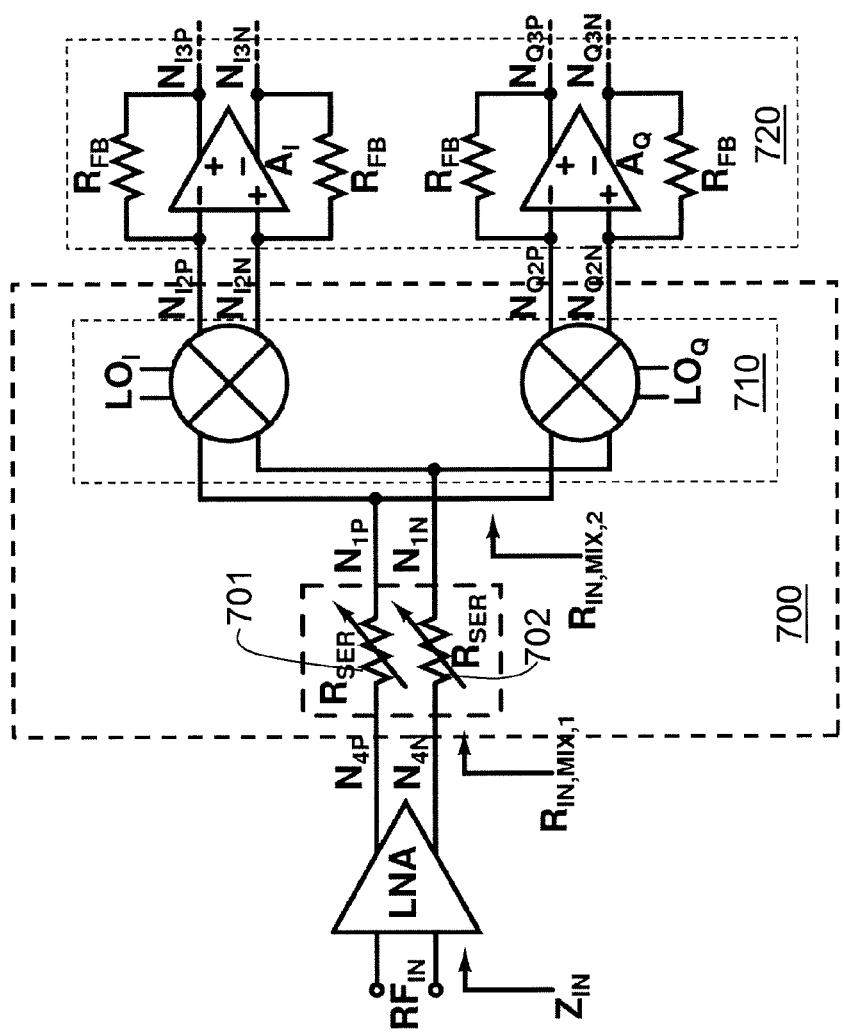
FIG. 7a is a schematic diagram illustrating a receiver with double-balanced programmable gain passive current-mode mixer according to embodiments herein.

According to some embodiments, a double-balanced mixer circuit 700 with programmable gain is shown in FIG. 7a. As shown in FIG. 7a, the mixer circuit 700 has a balanced signal path and comprises two resistor networks, a first resistor network 701 and a second resistor network 702, both are like the resistor network 300. The mixer circuit 700 further comprises an I/Q mixer 710 comprising an In-phase and a quadrature mixer, both are double-balanced. The I/Q mixer 710 operates with differential RF and LO signals, it is therefore called double-balanced. A first input terminal of the in-phase mixer is connected together with a first input terminal of the quadrature mixer and to the output terminal of the first resistor network 701. A second input terminal of the in-phase mixer is connected together with a second input terminal of the quadrature mixer and to the output terminal of the second resistor network 702. The first and second resistor networks 701, 702 may be connected in a single-ended or in a balanced form. If the first and second resistor networks 701, 702 are connected in the single-ended form, the third terminal in each of the switched resistor branches in the first and second resistor networks 701, 702 is connected to ground (as in FIG. 4).

Figure 7B:
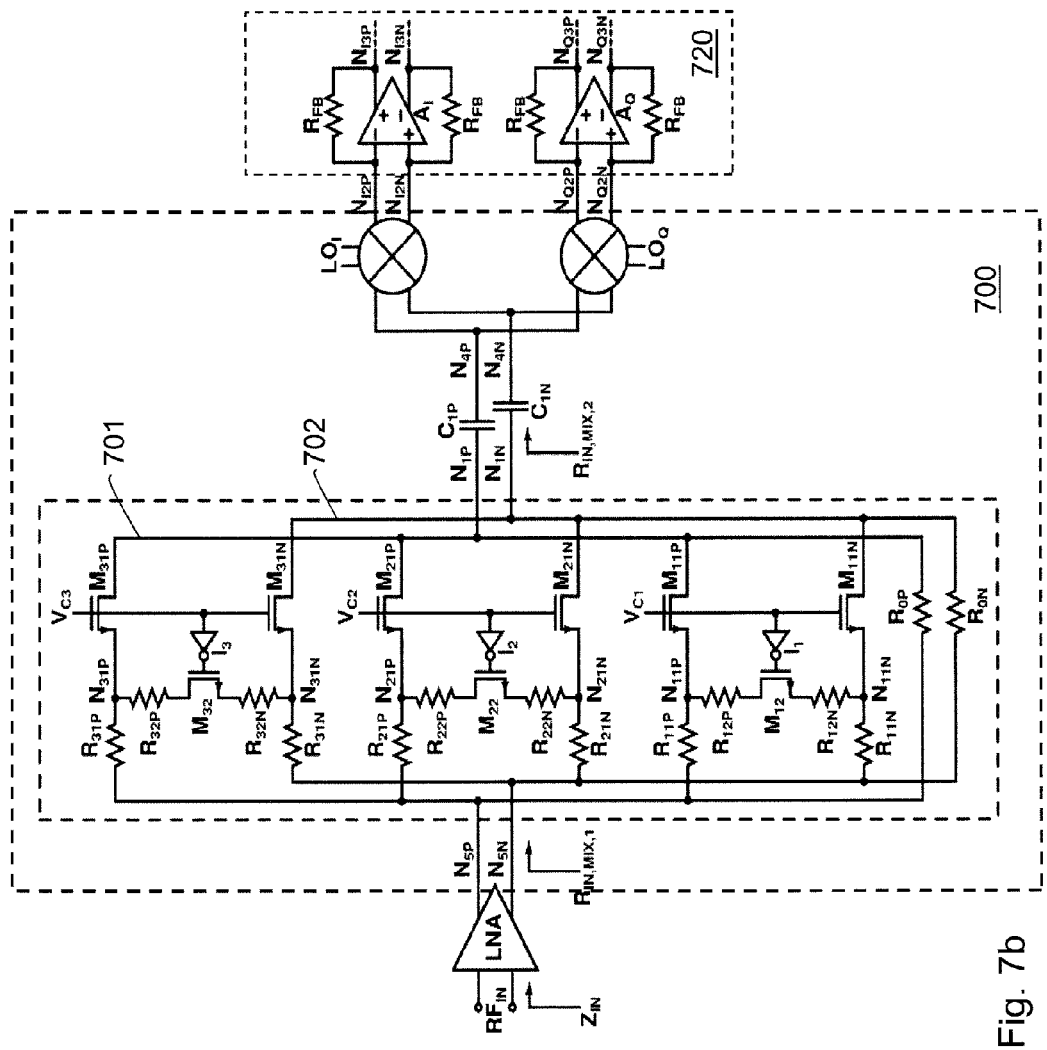
FIG. 7b is a schematic diagram illustrating more detailed implementation of the resistor network shown in FIG. 7a according to embodiments herein.

According to some embodiments, the first and second resistor networks 701, 702 may be connected in a balanced form. This is shown in more detail in FIG. 7b with 4 gain settings having 3 pairs of switched resistor branches. As shown in FIG. 7b, the first and second resistor networks 701, 702 each comprises 3 switched resistor branches. The first resistors $R_{11P}$, $R_{21P}$, $R_{31P}$, the second resistors $R_{12P}$, $R_{22P}$, $R_{32P}$ and the first switches $M_{11P}$, $M_{21P}$, $M_{31P}$ belong to the first resistor network 701. The first resistors $R_{11N}$, $R_{21N}$, $R_{31N}$, the second resistors $R_{12N}$, $R_{22N}$, $R_{32N}$ and the first switches $M_{11N}$, $M_{21N}$, $M_{31N}$ belong to the second resistor network 702. In this embodiment, second switches in each of the switched resistor branch in the first and second resistor networks 701, 702 are shared, i.e. each third terminal of the switched resistor branches in the first resistor network 701 is connected to a corresponding third terminal of the switched resistor branches in the second resistor network 702, and pairs of the second switches of the two resistor networks 701, 702 are therefore combined to single switches, i.e. $M_{12}$, $M_{22}$, $M_{32}$ .... Further, a first input terminal of the in-phase mixer is connected together with a first input terminal of the quadrature mixer and to the output terminal of the first resistor network 701 via a first capacitor $C_{1P}$. A second input terminal of the in-phase mixer is connected together with a second input terminal of the quadrature mixer and to the output terminal of the second resistor network 702 via a second capacitor $C_{1N}$. The outputs of the I/Q mixer 710 are connected to TIAs 720.

Again, the signal path of each switched resistor branch could be biased to 0V. The biasing details are not shown in the figure, and the gain control is similar to that of previous example embodiments.

Figure 8:
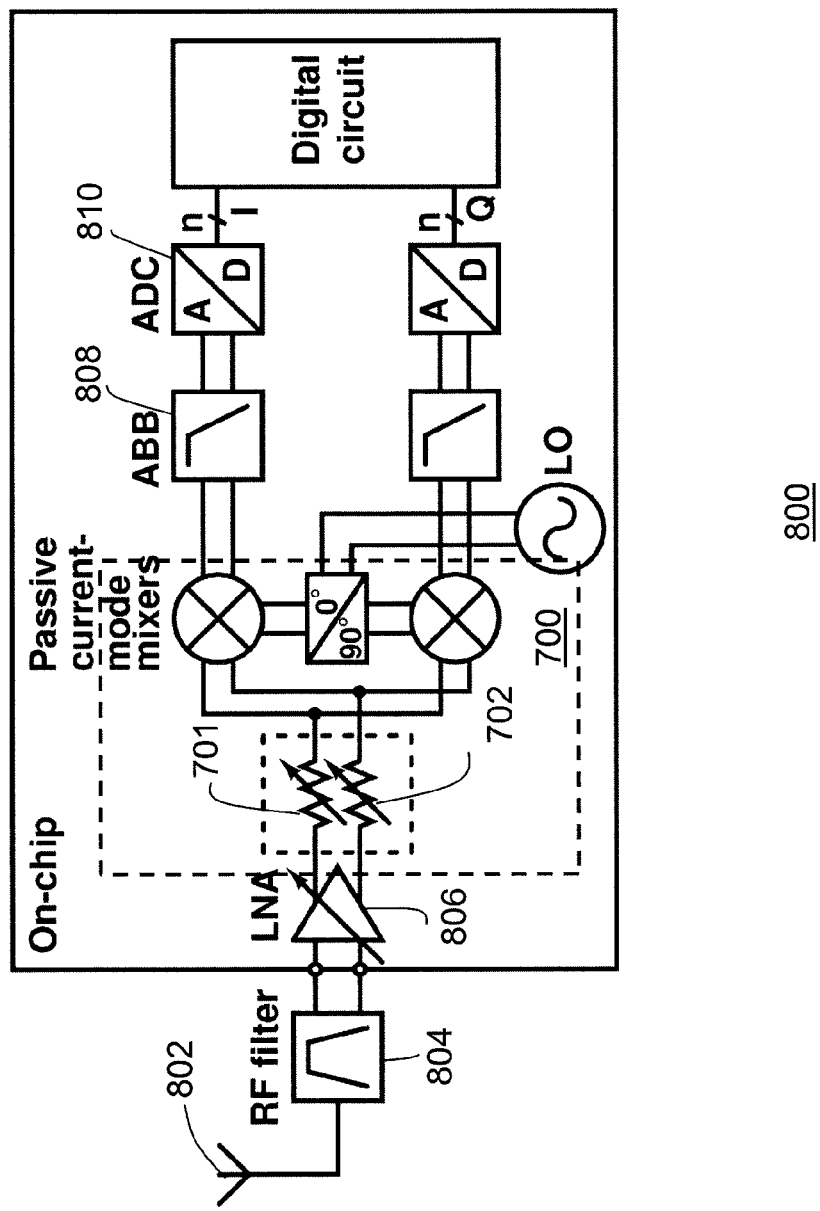
FIG. 8 is a block diagram illustrating a direct-conversion receiver using passive current-mode mixers with programmable gain implemented by two resistor networks according to embodiments herein.

According to some embodiments, a simplified block diagram of a direct conversion receiver 800 using the programmable gain passive current-mode mixer circuit 700 is shown in FIG. 8. An antenna 802 feeds a received RF signal to a RF filter 804 that performs pre-selection of received RF bands. An LNA 806 amplifies the selected RF signal and drives the down-conversion mixer circuit 700, which down-converts the amplified RF signal. The down-conversion mixer circuit 700 comprises two resistor networks 701,702 according to embodiments herein. The down-converted analog signal is filtered and amplified in low-pass filters and gain stages of Analog Baseband (ABB) 808 and then converted to a digital signal in Analog-to-Digital Converters (ADC) 810.

As a summary, the resistor network 300 according to embodiments herein has several advantages.

It enables more accurate gain steps in passive current-mode down-conversion mixers, which are commonly used due to their high dynamic range. The resistor network according to embodiments herein makes it possible to do a design centering for mixer gain steps in the typical PTV conditions and frequency of operation. Now, all margin or tolerance in the gain step accuracy can be allocated for the effect of variations in PTV parameters or the frequency of operation.

The resistor network 300 according to embodiments maintains a target input resistance or a certain impedance at all gain settings taking into account the input impedance of a circuit following the resistor network. The circuit may be a passive current-mode I/Q down conversion mixer.

The increase in silicon area by using the resistor network 300 according to embodiments herein compared to the R2R network is negligible.

The gain step is not limited to 6 dB or 1:2 by using the resistor network 300 according to embodiments herein.

The resistor network 300 according to embodiments herein does not increase the supply current.

The resistor network 300 according to embodiments herein may be implemented in modern CMOS processes on the same chip with the rest of a transceiver IC.

Figure 9:
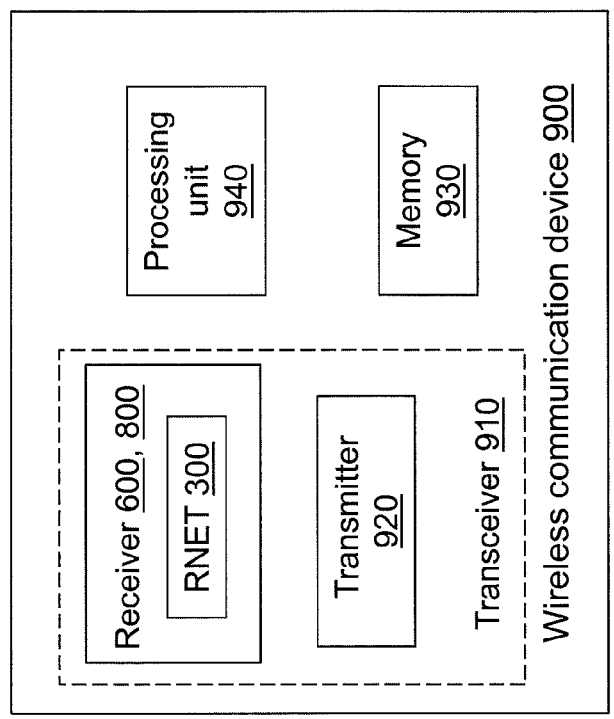
FIG. 9 is a block diagram illustrating a wireless device according to embodiments herein.

As an example, referred as RNET 300 in FIG. 9, wherein a wireless communication device 900 is shown, and the resistor network 300 may be implemented on the same chip with a transceiver 910. The wireless communication device 900 comprises a Receiver 600 or BOO, which comprises the resistor network 300. The wireless communication device 900 further comprises a Transmitter 920, a Memory 930 and a Processing unit 940.

Those skilled in the art will understand that although in the resistor network 300, gain-control switches are described and shown with N-channel Metal-Oxide-Semiconductor (NMOS) devices, the gain-control switches may be implemented by any other types of devices or transistors, such as Bipolar Junction Transistors (BJT), P-channel MOS (PMOS) devices, Complementary MOS (CMOS) devices etc. When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. A resistor network having an input terminal and an output terminal comprising: one or more switched resistor branches, wherein each switched resistor branch comprises:
a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
a second resistor connected in series with a second switch, between the middle node and a third terminal; and the resistor network further comprising:
a third resistor connected between the input and output terminals of the resistor network.

2. The resistor network according to claim 1, wherein the resistor network is operable to set a number of different gains between a maximum gain and a minimum gain for a circuit including the resistor network by switching on and off the first and second switches in each of the one or more switched resistor branches, wherein for each switched resistor branch if the first switch is switched on, the second switch is switched off and vice versa.

3. The resistor network according to claim 2, wherein the maximum gain is achieved by switching on the first switch and switching off the second switch in all of the one or more switched resistor branches, and the minimum gain is achieved by switching off the first switch and switching on the second switch in all of the one or more switched resistor branches.

4. The resistor network according to claim 2 wherein values of the first, second and third resistors are selected to provide an input impedance for the circuit including the resistor network which is similar for each of the different gains.

5. The resistor network according to claim 4, wherein values of the first, second and third resistors are selected to provide an input impedance for the circuit including the resistor network with a variation of ±10% between any two adjacent gain settings.

6. The resistor network according to claim 1, wherein the first and second switches are implemented by Metal-oxide semiconductor field-effect transistors.

7. The resistor network of claim 1 wherein the third resistor is connected between the input and output terminals of the resistor network via a switch.

8. A passive current-mode mixer circuit with programmable gain comprising:
a resistor network having an input terminal and an output terminal, the resistor network comprising:
one or more switched resistor branches, wherein each switched resistor branch comprises:
a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
a second resistor connected in series with a second switch, between the middle node and a third terminal; and the resistor network further comprising:
a third resistor connected between the input and output terminals of the resistor network; and
an I/Q mixer comprising an In-phase mixer and a Quadrature mixer, wherein the I/Q mixer is a single-ended mixer or a single-balanced mixer; and wherein
input terminals of the I/Q mixer are connected together and to the output terminal of the resistor network directly or via a capacitor, and the third terminal in each of the one or more switched resistor branches is connected to ground.

9. The passive current-mode mixer circuit of claim 8 wherein the third resistor is connected between the input and output terminals of the resistor network via a switch.

10. A receiver for use in a wireless communication device comprising:
a passive current-mode mixer circuit with programmable gain, comprising:
a resistor network having an input terminal and an output terminal, the resistor network comprising:
one or more switched resistor branches, wherein each switched resistor branch comprises:
a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
a second resistor connected in series with a second switch, between the middle node and a third terminal; and the resistor network further comprising:
a third resistor connected between the input and output terminals of the resistor network; and
an I/O mixer comprising an In-phase mixer and a Quadrature mixer, wherein the I/O mixer is a single-ended mixer or a single-balanced mixer; and wherein input terminals of the I/O mixer are connected together and to the output terminal of the resistor network directly or via a capacitor, and the third terminal in each of the one or more switched resistor branches is connected to ground; wherein
the input terminal of the resistor network is connected to an input of the receiver directly or through a passive network.

11. The receiver of claim 10 wherein the third resistor is connected between the input and output terminals of the resistor network via a switch.

12. A passive current-mode mixer circuit with programmable gain comprising:
a first and a second resistor network, each resistor network having an input terminal and an output terminal and comprising:
one or more switched resistor branches, wherein each switched resistor branch comprises:
a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
a second resistor connected in series with a second switch, between the middle node and a third terminal; and the resistor network further comprising:
a third resistor connected between the input and output terminals of the resistor network; and
an I/Q mixer comprising an In-phase mixer and a Quadrature mixer, wherein the I/Q mixer is a double-balanced mixer; and wherein
the input terminal of the first resistor network is a first differential input terminal,
the input terminal of the second resistor network is a second differential input terminal,
a first input terminal of the in-phase mixer is connected together with a first input terminal of the quadrature mixer and to the output terminal of the first resistor network directly or via a first capacitor,
a second input terminal of the in-phase mixer is connected together with a second input terminal of the quadrature mixer and to the output terminal of the second resistor network directly or via a second capacitor,
and the third terminal in each of the one or more switched resistor branches in the first and second resistor networks is connected to ground.

13. The passive current-mode mixer circuit of claim 12 wherein the third resistor is connected between the input and output terminals of the resistor network via a switch.

14. A passive current-mode mixer circuit with programmable gain comprising:
a first and a second resistor network, each resistor network having an input terminal and an output terminal and comprising:
one or more switched resistor branches, wherein each switched resistor branch comprises:
a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
a second resistor connected in series with a second switch, between the middle node and a third terminal; and the resistor network further comprising:
a third resistor connected between the input and output terminals of the resistor network; and
an I/Q mixer comprising an In-phase mixer and a Quadrature mixer, wherein the I/Q mixer is a double-balanced mixer; and wherein
the input terminal of the first resistor network is a first differential input terminal,
the input terminal of the second resistor network is a second differential input terminal,
a first input terminal of the in-phase mixer is connected together with a first input terminal of the quadrature mixer and to the output terminal of the first resistor network directly or via a first capacitor,
a second input terminal of the in-phase mixer is connected together with a second input terminal of the quadrature mixer and to the output terminal of the second resistor network directly or via a second capacitor,
and the third terminal in each of the one or more switched resistor branches in the first resistor network is connected to a corresponding third terminal of one of the one or more switched resistor branches in the second resistor network, and wherein pairs of the second switches of the two resistor networks are combined to single switches.

15. The passive current-mode mixer circuit of claim 14 wherein the third resistor is connected between the input and output terminals of the resistor network via a switch.

16. A receiver for use in a wireless communication device comprising:
a low noise amplifier with single-ended or differential input and differential output;
a passive current-mode mixer circuit with programmable gain comprising:

a first and a second resistor network, each resistor network having an input terminal and an output terminal and comprising:
  one or more switched resistor branches, wherein each switched resistor branch comprises:
    a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
    a second resistor connected in series with a second switch, between the middle node and a third terminal; and the resistor network further comprising:
      a third resistor connected between the input and output terminals of the resistor network; and
an I/O mixer comprising an In-phase mixer and a Quadrature mixer, wherein the I/O mixer is a double-balanced mixer; and wherein
the input terminal of the first resistor network is a first differential input terminal,
the input terminal of the second resistor network is a second differential input terminal,
a first input terminal of the in-phase mixer is connected together with a first input terminal of the quadrature mixer and to the output terminal of the first resistor network directly or via a first capacitor,
a second input terminal of the in-phase mixer is connected together with a second input terminal of the quadrature mixer and to the output terminal of the second resistor network directly or via a second capacitor,
and the third terminal in each of the one or more switched resistor branches in the first and second resistor networks is connected to ground; wherein
the differential input terminals are connected to first and second differential outputs of the low noise amplifier respectively.

17. The receiver of claim 16 wherein the third resistor is connected between the input and output terminals of the resistor network via a switch.

18. A wireless communication device comprising one or more receivers, each receiver comprising:
  a passive current-mode mixer circuit with programmable gain, comprising:
    a resistor network having an input terminal and an output terminal, the resistor network comprising:
      one or more switched resistor branches, wherein each switched resistor branch comprises:
        a first resistor connected in series with a first switch, wherein a first end of the first resistor is connected to the input terminal of the resistor network, a second end of the first resistor is connected to a first end of the first switch forming a middle node, and a second end of the first switch is connected to the output terminal of the resistor network; and
        a second resistor connected in series with a second switch, between the middle node and a third terminal; and the resistor network further comprising:
          a third resistor connected between the input and output terminals of the resistor network; and
    an I/O mixer comprising an In-phase mixer and a Quadrature mixer, wherein the I/O mixer is a single-ended mixer or a single-balanced mixer; and wherein
    input terminals of the I/O mixer are connected together and to the output terminal of the resistor network directly or via a capacitor, and the third terminal in each of the one or more switched resistor branches is connected to ground; wherein
  the input terminal of the resistor network is connected to an input of the receiver directly or through a passive network.

19. The wireless communication device of claim 18 wherein the third resistor is connected between the input and output terminals of the resistor network via a switch.

* * * * *